(12) United States Patent
Ryu

(10) Patent No.: US 7,365,298 B2
(45) Date of Patent: Apr. 29, 2008

(54) IMAGE SENSOR AND METHOD FOR MANUFACTURING THE SAME

(75) Inventor: Sang-wook Ryu, Cheongju-si (KR)

(73) Assignee: Hynix Semiconductor Inc., Kyungki-do (JP)

( * ) Notice: Subject to any disclaimer, the term of this patent is extended or adjusted under 35 U.S.C. 154(b) by 219 days.

(21) Appl. No.: 10/945,182

(22) Filed: Sep. 20, 2004

(65) Prior Publication Data

US 2005/0067554 A1   Mar. 31, 2005

(30) Foreign Application Priority Data

Sep. 29, 2003   (KR) .................... 10-2003-0067561

(51) Int. Cl.
*H01L 21/77* (2006.01)
(52) U.S. Cl. .................. 250/208.1; 250/226; 257/294; 438/70; 438/57
(58) Field of Classification Search ............. 250/208.1, 250/226; 257/294, 223, 225, 215; 438/70, 438/57, 69, 73
See application file for complete search history.

(56) References Cited

U.S. PATENT DOCUMENTS 6,228,674 B1   5/2001   Pan
6,362,498 B2   3/2002   Abramovich
6,784,014 B2 *   8/2004   Tanigawa .................... 438/60

OTHER PUBLICATIONS www.siliconfareast.com, 2004.*

* cited by examiner

*Primary Examiner*—Thanh X. Luu
*Assistant Examiner*—Tony Ko
(74) *Attorney, Agent, or Firm*—Marshall Gerstein & Borun LLP

(57) ABSTRACT

The present invention discloses an image sensor and a method for manufacturing the same which is capable of increasing the light-collection efficiency of a photodiode. The image sensor comprises: at least one photodiode formed on a semiconductor substrate; multilayer interlayer insulating films formed on the photodiode and stacked in at least two layers so that the density of the upper interlayer insulating film becomes lower than that of the lower interlayer insulating film as the multilayer interlayer insulating films proceed upward; a light shield layer and an element-protecting film sequentially stacked on the multilayer interlayer insulating film; color filter arrays and a flattening layer sequentially stacked on the element-protecting film; and microlenses arranged on the positions corresponding to the color filters on the flattening layer. Therefore, the light-collection efficiency of the photodiode can be increased with an increased transmittance of a vertical light reaching to the photodiode by making the multilayer interlayer insulating films have a lower density as they proceed upward to decrease the refraction angle of the incident light penetrated through the microlenses and color filters.

12 Claims, 4 Drawing Sheets

IMAGE SENSOR AND METHOD FOR MANUFACTURING THE SAME

BACKGROUND OF THE INVENTION

1. Field of the Invention

The present invention relates to an image sensor and a method for manufacturing the same, and more particularly, to an image sensor, which is capable of increasing the light-collection efficiency of a photodiode, and a method for manufacturing the same.

2. Description of the Related Art

Generally, an image sensor is a semiconductor device that converts an optical image into an electric signal. Among the image sensors, a charge coupled device (CCD) is a device wherein each metal-oxide-silicon (hereinafter referred as to MOS) capacitor is closely located and charge carriers are stored into the MOS capacitor and transferred. A complementary metal oxide semiconductor (hereinafter referred as to CMOS) image sensor employs CMOS technology that uses a control circuit and a signal processing circuit as peripheral circuits to form as many arrays of MOS transistors as the number of pixels, and adopts a switching mode that detects outputs sequentially. MOS transistors formed in the peripheral circuit as the same number of pixels.

In manufacturing such a variety of image sensors, there have been many endeavors to increase the photosensitivity of the image sensor. Among those endeavors to increase the photosensitivity, a light-collecting technique is the most important technique.

The image sensor generally includes photosensitive circuit parts sensing light and CMOS logic circuit parts transforming the light into electric signals and generating data. Recently, there have been many studies of light-collecting techniques by which the pathways of the incident lights injecting to the regions other than the photosensitive circuit parts are changed and collected in photodiodes that are photosensitive elements.

FIG. 1 is a cross sectional view showing an image sensor in accordance with a prior art, in which the main components of a conventional CMOS image sensor are directly related to light-collection are illustrated.

Referring to FIG. 1, the prior art image sensor includes a plurality of field insulating films 10 formed on a semiconductor substrate (not shown), at least one photodiode 12 which is an optical active region formed between these field insulating films 10, multilayer interlayer insulating films 14 and 18 insulating between layers of the top parts of the field insulating films 10 and photodiode 12 and a light shield layer 16 formed of metal or the like in the interlayer insulating film 18 in order to prevent incident light from being focused onto the field insulating films 10. An element-protecting film 20 is formed on the interlayer insulating film 18, and an interlayer insulating film 24 is formed on the element-protecting film 20. The color filter arrays 22a, 22b and 22c of red, green and blue are formed in the interlayer insulating film 24. A flattening layer 26 is formed over these color filter arrays 22a, 22b and 22c. Microlenses 28 are formed at the positions corresponding to the color filters 22a, 22b and 22c.

As the materials of the color filters 22a, 22b and 22c of red, green and blue, mainly used are photoresists dyed in colors capable of absorbing only the light of a specific wavelength. As the materials of the microlenses 28, mainly used are polymer type resins.

The interlayer insulating films 14, 18 and 24 and the element-protecting film 20 are typically made by using silicon oxide films that are transparent insulating materials.

The flattening layer 26 is made by using a photoresist in order to compensate for the roughness of the color filters.

In the constructed conventional CMOS image sensor, the incident light received via the microlenses 28 is separated into corresponding red, green and blue light through the red color filter 22a, green color filter 22b and blue color filter 22c. The separated red, green and blue lights are focused on the photodiode 12 at the positions corresponding to the color filters through the element-protecting film 20 and the interlayer insulating films 14 and 18, respectively. The light shield layer 16 arranged between the interlayer insulating films 14 and 18 plays the role of shielding the incident light so as not to deviate to other light pathways.

However, if the incident light on the photodiode through the microlenses 28 and the color filters 22a, 22b and 22c is not focused in parallel but focused to other light pathways, the photodiode 12 in the corresponding light pathway will be unable to sense the light or interference will occur with other adjacent photodiode 12. Such a phenomenon acts as noise in embodying a high performance image in a CMOS image sensor.

SUMMARY OF THE INVENTION

The present invention is designed in consideration of the problems of the prior art, and therefore it is an object of the present invention to provide an image sensor which can improve the light-collection efficiency of the photodiode with an increased transmittance of vertical light reaching the photodiode by making the multi-layer interlayer insulating films have a lower density as they proceed upward to decrease the refraction angle of the incident light penetrated through the microlenses and color filters, and a method for manufacturing the same.

To achieve the above object, there is provided an image sensor in accordance with the present invention, comprising: at least one photodiode formed on a semiconductor substrate; multi-layer interlayer insulating films formed on the photodiode and stacked in at least two layers so that the density of the upper interlayer insulating film becomes lower than that of the lower interlayer insulating film as the multi-layer interlayer insulating films proceed upward; a light shield layer and an element-protecting film sequentially stacked on the multi-layer interlayer insulating film; color filter arrays and a flattening layer sequentially stacked on the element-protecting film; and microlenses arranged on the positions corresponding to the color filters on the flattening layer.

BRIEF DESCRIPTION OF THE DRAWINGS

Other objects and aspects of the present invention will become apparent from the following description of embodiments with reference to the accompanying drawings in which.

DESCRIPTION OF THE PREFERRED EMBODIMENT

Figure 1:
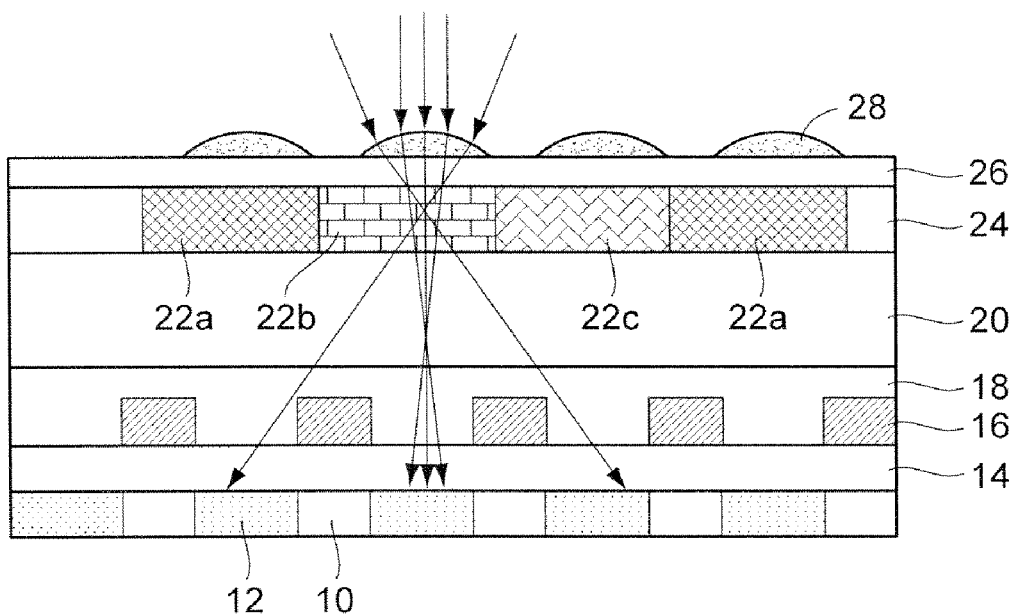
FIG. 1 is a cross sectional view showing an image sensor in accordance with a prior art.

Hereinafter, a preferred embodiment of the present invention will be described in more detail referring to the drawings.

Figure 2:
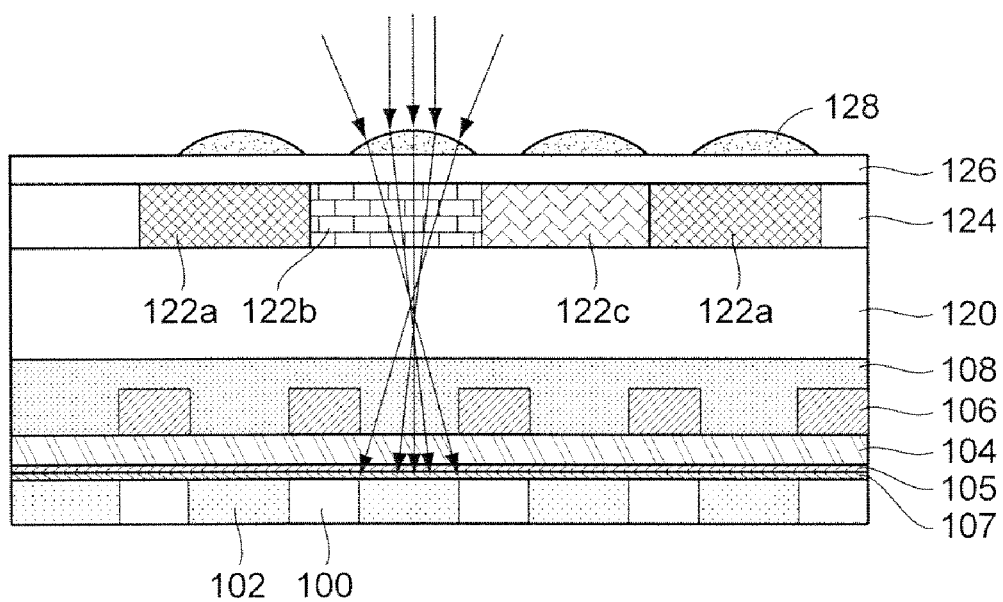
FIG. 2 is a cross sectional view showing the structure of an image sensor in accordance with the present invention.

FIG. 2 is a cross sectional view showing the structure of an image sensor in accordance with the present invention, in which the main components of the CMOS image sensor of this invention directly related to light-collection are illustrated.

Referring to FIG. 2, the CMOS image sensor of this invention includes a plurality of field insulating films 100 formed on a semiconductor substrate (not shown), at least one photodiode 102 which is an optical active region formed between these field insulating films 100, multi-layer interlayer insulating films 104 and 108 insulating between layers of the top parts of the field insulating films 100 and photodiode 102 and being stacked in at least two layers so that the density is lower in upper parts than lower parts and a light shield layer 106 formed of metal or the like in the interlayer insulating film 108 in order to prevent an incident light from being focused onto the field insulating films 100.

An element-protecting film 120 is formed on the interlayer insulating film 108, and an interlayer insulating film 124 is formed on the element-protecting film 120. The color filter arrays 122a, 122b and 122c of red, green and blue are formed in the interlayer insulating film 124. A flattening layer 116 is formed over these color filter arrays 122a, 122b and 122c. Microlenses 128 are formed on the positions corresponding to the color filters 122a, 122b and 122c.

As the materials of the color filters 122a, 122b and 122c of red, green and blue, mainly used are photoresists dyed in colors capable of absorbing only the light of a specific wavelength. As the materials of the microlenses 128, mainly used are polymer type resins. At this time, the interlayer insulating films 104 and 108 below the color filter arrays 122a, 122b and 122c are made so that the density of the interlayer insulating film in the upper side is lower than that of the interlayer insulating film in the lower side. For this, in the present invention, the density of an oxide film becomes higher in the order of PE-CVD<HDP-CVD<LP-CVD<thermal oxidation. Further, if the deposition temperature is lowered, the density of the oxide film is lowered. Accordingly, it is possible to carry out a density adjustment by this deposition process and by the adjustment of the deposition temperature. For example, in the manufacture of the interlayer insulating film 108 in the upper side, an oxide film is deposited by PE-CVD or HDP-CDP and in a low temperature range. On the contrary, in the manufacture of the interlayer insulating film 104 in the lower side, an oxide film is deposited by LP-CVD or a thermal oxidization process and deposited in the range of a higher temperature in comparison with the interlayer insulating film in the upper side. Also, it is possible to adjust the density of the upper interlayer insulating film 108 to be lower than that of the lower interlayer insulating film 104 by adjusting the deposition temperature while carrying out the same deposition process to all of the upper and lower interlayer insulating films 108 and 104.

In the present invention, the interlayer insulating films 104 and 108 are transparent insulating materials and typically formed of silicon oxide films. At this time, the density can be lowered by increasing the concentration of impurities to be doped in the upper interlayer insulating film than in the lower interlayer insulating film. For example, if the interlayer insulating film 104 in the lower position is deposited with FSG, BPSG, PSG and BSG and the interlayer insulating film 108 in the upper position is deposited with USG, the density of the interlayer insulating film in the upper position becomes lower than that of the interlayer insulating film in the lower position.

The element-protecting film 120 is typically formed of a silicon oxide film that is a transparent insulating material, and the flattening layer 116 is formed of a photoresist in order to compensate for the roughness of the color filters.

In the CMOS image sensor of the above-described structure of the present invention, the incident light received via the microlenses 128 are separated into the corresponding red light, green light and blue light through the red color filter 122a, green color filter 122b and blue color filter 122c. The separated red, green and blue lights are focused on the photodiode 102 at the positions corresponding to the color filters through the element-protecting film 120 and the interlayer insulating films 108 and 104. The light shield layer 106 arranged between the interlayer insulating films 104 and 108 plays a role of shielding the incident light so as not to deviate to other light pathways.

Further, according to the present invention, in the multi-layer interlayer insulating films 104 and 108 included in the CMOS image sensor, the density of the interlayer insulating film 108 in the upper position is lower than that of the interlayer insulating film 104 in the lower position. Due to this, the red, green and blue lights penetrated through the microlenses 128 and the color filters 122a, 122b and 122c are focused on the photodiode 102 in vertical light pathways without a light loss as the refraction angle on those interlayer insulating films 108 and 104 decreases until the incident lights are focused on the photodiode 102. The light shield layer 106 arranged between the interlayer insulating films 108 and 104 plays a role of shielding the incident lights so as not to deviate to other light pathways.

As shown, in the present invention, a borderless contact or a photosensitivity adjusting film 105 is also formed of a silicon oxide film or the like below the multi-layer interlayer insulating films 104 and 108. Also, a buffer insulating film 107 may be additionally formed of a silicon oxide film below the photosensitivity adjusting film.

Next, the process for manufacturing the thus constructed CMOS image sensor in accordance with the present invention will be described.

First, in order to insulate elements of the CMOS image sensor electrically, a field insulating film 100 is formed on a silicon substrate (not shown) and at least one photodiode 102 is formed in the gaps of the field insulating film 100.

Next, an upper interlayer insulating film 104 having a large density is deposited on the entire surface of the field insulating film 100 and photodiode 102, and a light shield layer 106 of metal or the like is formed thereon.

Continually, an upper interlayer insulating film 108 flattened and having a low density is formed over the entire surface of the lower interlayer insulating film 104 on which the light shield layer 106 is formed. Here, the adjusting processes of the deposition temperature and the impurity concentration in the deposition process for adjusting the density difference between the lower interlayer insulating film 104 and the upper interlayer insulating film 108 have been described above, the description thereof will be omitted.

Next, in order to protect the elements from moisture or scratching, a flattened element-protecting film 120 is formed on the entire surface of the upper interlayer insulating film 108.

Then, a photoresist dyed in red, green and blue is applied onto the flattened element-protecting film 120 and developed, to form arrays of color filters 122a, 122b and 122c of red, green and blue, and then form a flattened interlayer insulating film 124 on the sides of the color filter arrays 122a, 122b and 122c. On the entire surface of the resultant material, a flattening layer 116 for flattening and adjusting the focal distance is formed. Next, microlenses 128 are formed on the flattening layer 116 at the positions corresponding to the red, green and blue color filters 122a, 122b and 122c.

FIGS. 3a to 3g are views showing a process for manufacturing multi-layer wiring in multi-layer interlayer insulating films of the image sensor in accordance with the present invention.

Figure 3A:
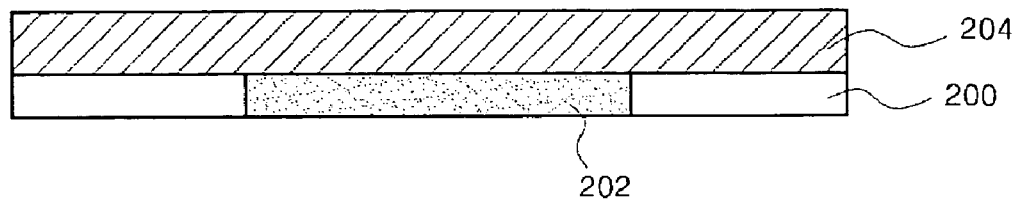
FIGS. 3a to 3g are process views showing a process for manufacturing multi-layer wiring in multi-interlayer insulating films of the image sensor in accordance with the present invention.

First, as shown in FIG. 3a, a field insulating film 200 for electrically insulating elements of a CMOS image sensor formed on a semiconductor substrate (not shown), and at least one photodiode 202 is formed in the gaps of the interlayer insulating film 200. Next, a BPSG having a high rate of flow is deposited at 2000 to 15000 Å on the field insulating film 200 and photodiode 202, and its surfaces are polished by chemical mechanical polishing (CMP) to thus forming a first interlayer insulating film 204 of 2000 to 9000 Å and then flatten it.

Figure 3B:
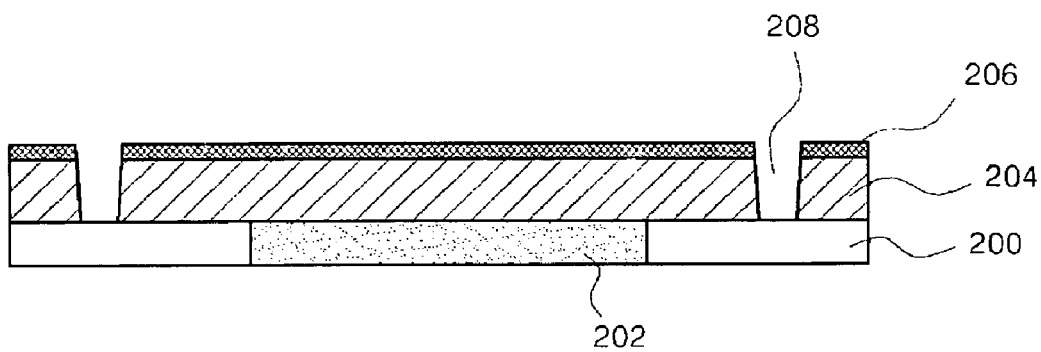

Next, as shown in FIG. 3b, HDP-USG is deposited at 300 to 9000 Å to form a second interlayer insulating film 206 having a high density. Then, the second and first interlayer insulating films 206 and 204 are etched to form contact holes 208.

Figure 3C:
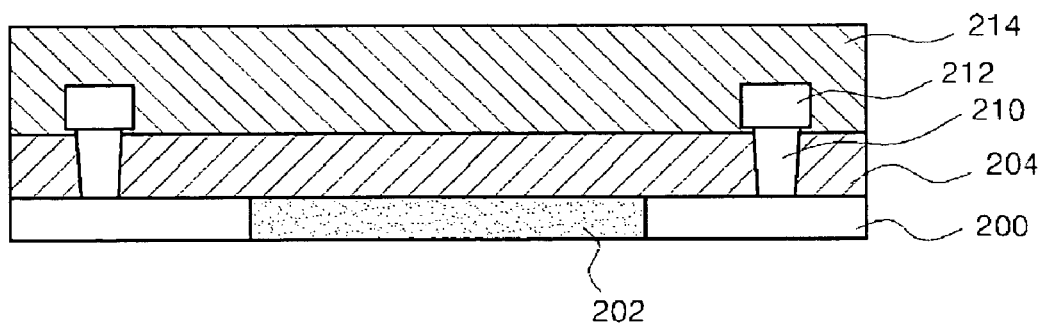

Continually, glue layer/barrier metal layer (not shown) such as Ti/TiN are deposited on the contact holes 208. As shown in FIG. 3c, metal such as tungsten, etc. is buried and patterned to form first contacts 210 and metal wires 212. Next, HDP-FSG is deposited at 9000 to 40000 Å to form a third interlayer insulating film 214 having a lower density than the second interlayer insulating film 206 and flatten the surface thereof by CMP.

Figure 3D:
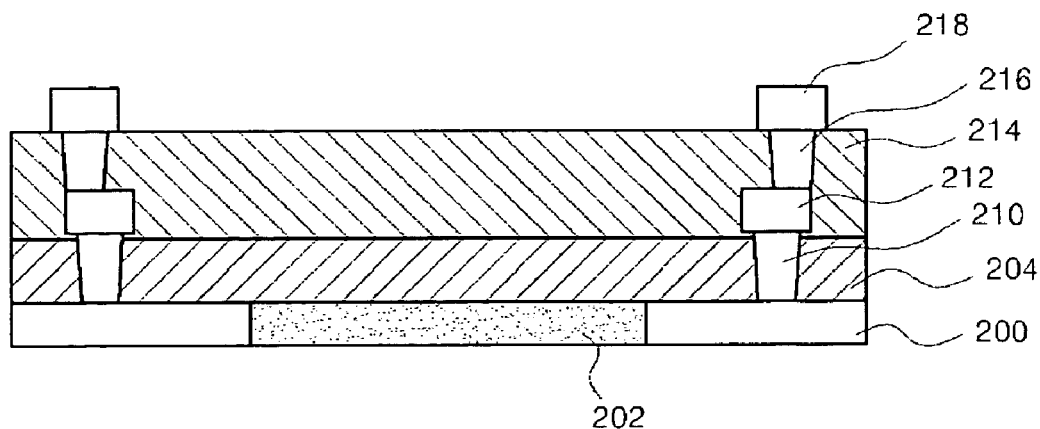

Next, as shown in FIG. 3d, via holes are formed on the third interlayer insulating film 214 and tungsten plugs 216 and second metal wires 218 connected to the first metal wires 212 in the lower position are formed in the via holes.

Figure 3E:
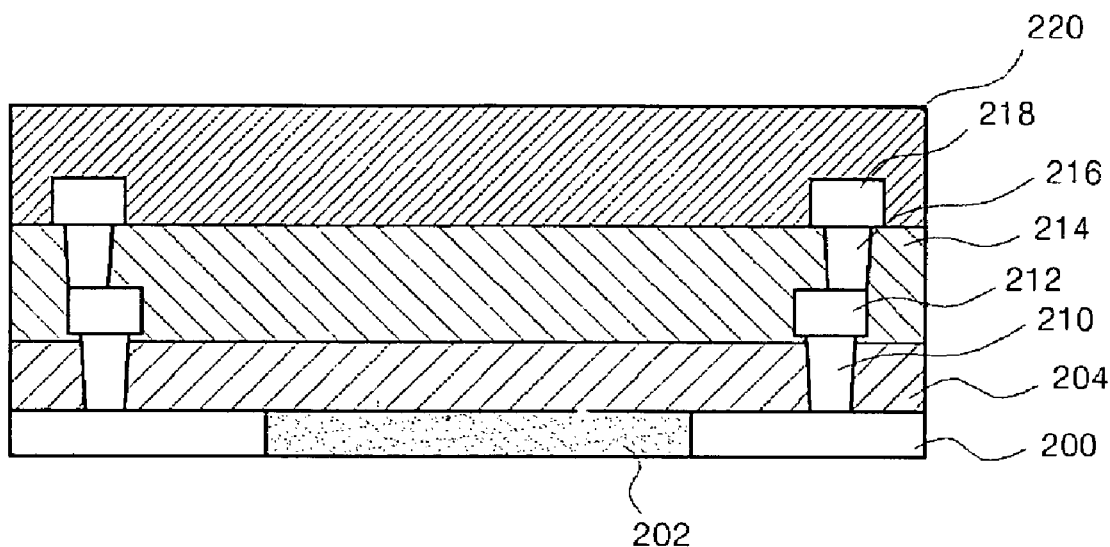

Continually, as shown in FIG. 3e, PE-USG is deposited at 3000 to 8000 Å to form a fourth interlayer insulating film 220 having a lower density than the third interlayer insulating film 214 and flatten the surface thereof by CMP.

Figure 3F:
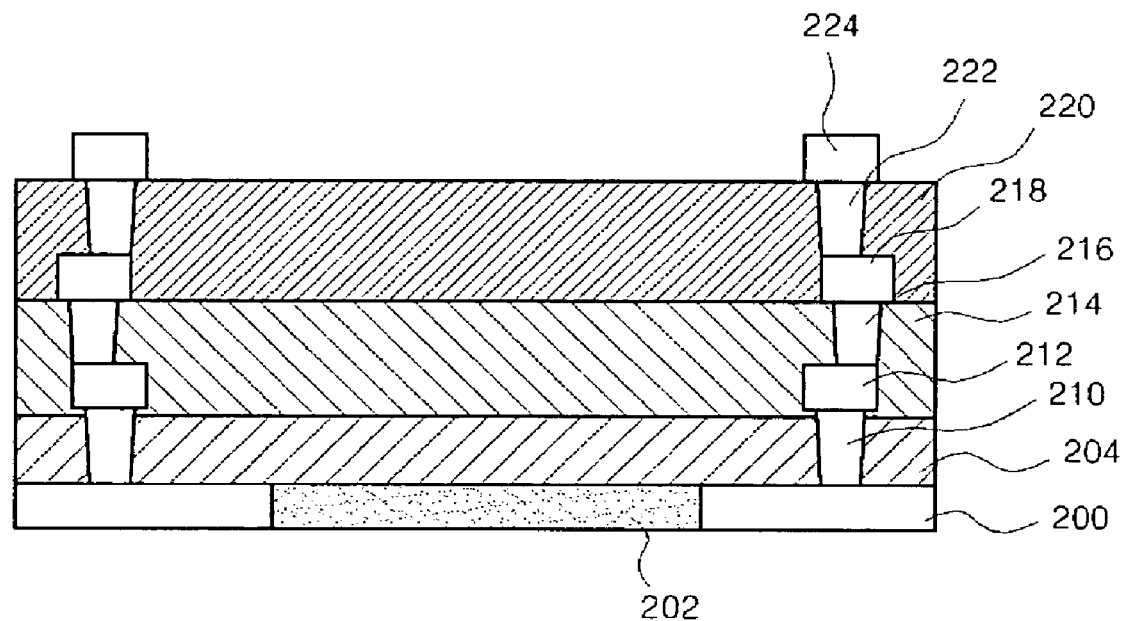

Continually, as shown in FIG. 3f, via holes are formed on the fourth interlayer insulating film 220 and tungsten plugs 222 and second metal wires 224 connected to the second metal wires 218 in the lower position are formed in the via holes.

Figure 3G:
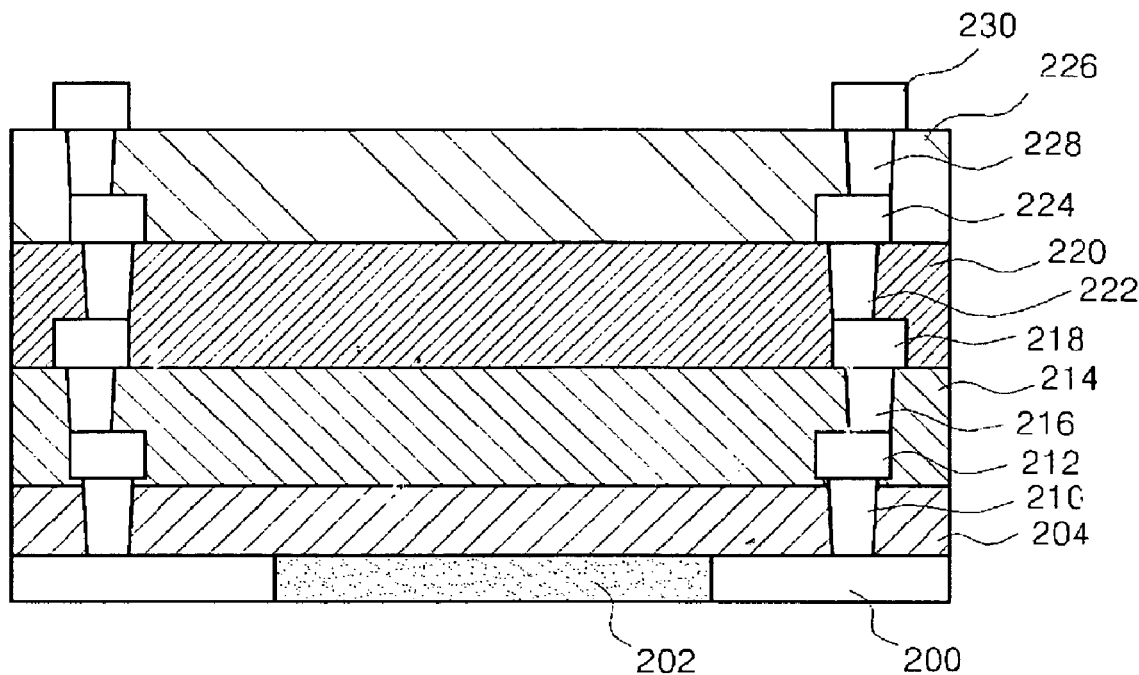

Next, as shown in FIG. 3g, PE-FSG is deposited at 500 to 20000 Å to form a fifth interlayer insulating film 226 having a lower density than the fourth interlayer insulating film 220 and flatten the surface thereof by CMP. Afterwards, tungsten plugs 228 and fourth metal wires 230 connected to the third metal wires 224 in the upper position are formed in the fifth interlayer insulating film 226.

As seen above, in the multi-layer interlayer insulating films of the CMOS image sensor of FIG. 2 and in the multi-layer interlayer insulating films having multi-layer metal wirings of FIGS. 3a to 3g, the density of the interlayer insulating film is lower in the upper position than in the lower position, thus making it possible to lower the refraction angle of an incident light.

Figure 4:
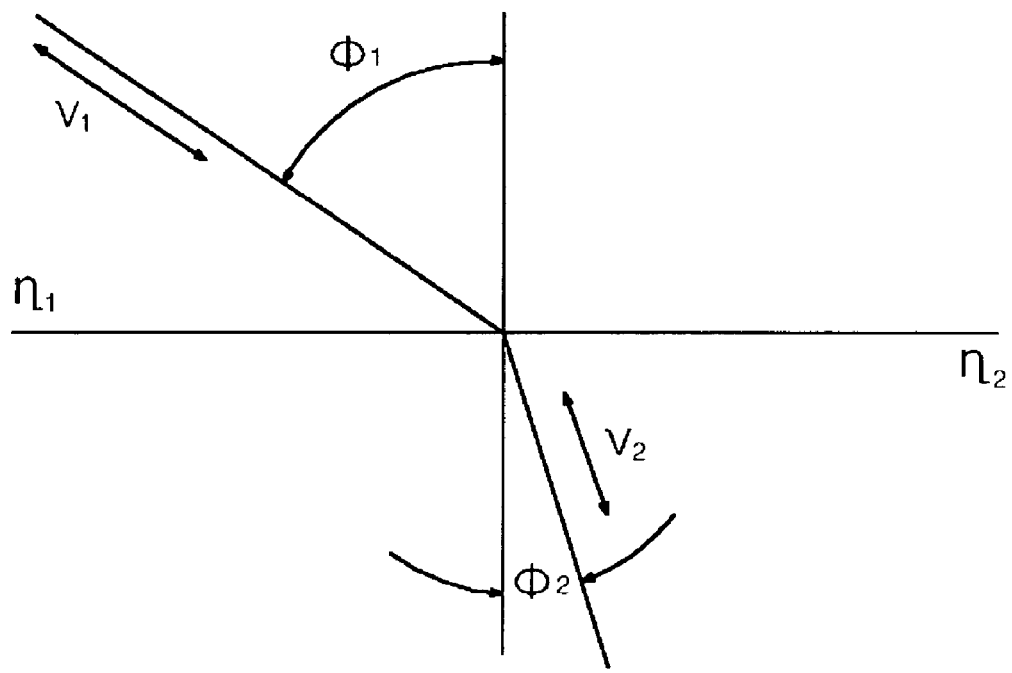
FIG. 4 is a view for explaining the difference of the index of refraction caused by a density difference in the multi-layer interlayer insulating film of the image sensor in accordance with the present invention.

FIG. 4 is a view for explaining the difference of the index of refraction caused by a density difference in the multi-layer interlayer insulating film of the image sensor in accordance with the present invention. In this drawing, the density is n1<n2 and has a size of Φ1(incident angle)>Φ2(refraction angle). Herein, the incident light injected to a medium n2 having a high density from a medium n1 having a low density has a refraction angle Φ2 smaller than the incident angle Φ1.

Subsequently, in the multi-layer interlayer insulating film of the present invention, the density of the interlayer insulating film in the upper position is lower than that of the interlayer insulating film in the lower position. Resultantly, since the density of the interlayer insulating film in the upper position becomes lower than that of the interlayer insulating film in the lower position as the multi-layer interlayer insulating films proceed upward, the refraction angle of the incident light becomes smaller and smaller. Due to this, while the light penetrated through the microlenses and color filters reaches the photodiode in a lower position, the refraction angle becomes smaller and smaller by the multi-layer interlayer insulating film whose density difference gradually increases, and thereby the light is not refracted to other light pathways but reaches the photodiode at a right angle.

As described above, the present invention can improve the light-collection efficiency of the photodiode with an increased transmittance of a vertical light reaching to the photodiode by making the multi-layer interlayer insulating films have a lower density as they proceed upward to decrease the refraction angle of the incident light penetrated through the microlenses and color filters. Accordingly, the optical properties of the image sensor can be enhanced because the loss of the light as being refracted to other light pathways can be minimized.

While the present invention has been described with respect to certain preferred embodiment only, other modifications and variations may be made without departing from the spirit and scope of the present invention as set forth in the following claims

What is claimed is:

1. An image sensor, comprising:
   at least one photodiode formed on a semiconductor substrate;
   multi-layer interlayer insulating films formed on the photodiode and stacked in at least two layers of oxide film having different density and the refractive index so that the density and the refractive index of the upper interlayer insulating film becomes lower than that of the lower interlayer insulating film as the multi-layer interlayer insulating films proceed upward;
   a light shield layer and an element-protecting film sequentially stacked on the multi-layer interlayer insulating film;
   color filter arrays and a flattening layer sequentially stacked on the element-protecting film; and
   microlenses arranged on the positions corresponding to the color filters on the flattening layer.

2. The image sensor of claim 1, wherein the density of the oxide films becomes higher in the order of PE-CVD<HDP-CVD<LP-CVD<thermal oxidations.

3. The image sensor of claim 1, multi-layer wiring is vertically formed on the multi-layer interlayer insulating films, the element-protecting film and the flattening layer.

4. The image sensor of claim 1, further comprising a photosensitivity adjusting film formed below the multi-layer interlayer insulating films.

5. The image sensor of claim 4, further comprising a buffer insulating film formed below the photosensitivity adjusting film.

6. A method for manufacturing an image sensor, comprising the steps of:
- making at least one photodiode on a semiconductor substrate;
- forming on the photodiode multi-layer interlayer insulating films stacked in at least two layers of oxide film having different density and the refractive index so that the density and the refractive index of the upper interlayer insulating film becomes lower than that of the lower interlayer insulating film as the multi-layer interlayer insulating films proceed upward;
- forming a light shield layer and an element-protecting film sequentially stacked on the multi-layer interlayer insulating film;
- forming color filter arrays and a flattening layer sequentially stacked on the element-protecting film; and
- forming microlenses arranged on the positions corresponding to the color filters on the flattening layer.

7. The method of claim 6, wherein the density of the oxide films becomes higher in the order of PE-CVD<HDP-CVD<LP-CVD<thermal oxidation.

8. The method of claim 7, wherein the density of the upper interlayer insulating film becomes lower than that of the lower interlayer insulating film by adjusting the deposition process, the deposition temperature and the concentration of impurities doped on the interlayer insulating films.

9. The method of claim 6, wherein the multi-layer interlayer insulating films are formed of oxides and the density is lowered by making the concentration of impurities to be doped higher in the upper interlayer insulating film than in the lower interlayer insulating film.

10. The method of claim 6, further comprising the step of forming multi-layer wiring in the step of forming the multi-layer interlayer insulating films, the element-protecting film and the flattening layer.

11. The method of claim 6, further comprising the step of forming a photosensitivity adjusting film below the multi-layer interlayer insulating films.

12. The method of claim 11, further comprising the step of forming a buffer insulating film below the photosensitivity adjusting film.

* * * * *

UNITED STATES PATENT AND TRADEMARK OFFICE
CERTIFICATE OF CORRECTION

PATENT NO. : 7,365,298 B2 Page 1 of 1
APPLICATION NO. : 10/945182
DATED : April 29, 2008
INVENTOR(S) : Sang Wook Ryu It is certified that error appears in the above-identified patent and that said Letters Patent is hereby corrected as shown below:

At Column 6, line 58, "oxidations" should be -- oxidation --.

Signed and Sealed this

Second Day of September, 2008

JON W. DUDAS
*Director of the United States Patent and Trademark Office*